United States Patent
Wang et al.

(10) Patent No.: US 7,253,493 B2
(45) Date of Patent: Aug. 7, 2007

(54) HIGH DENSITY ACCESS TRANSISTOR HAVING INCREASED CHANNEL WIDTH AND METHODS OF FABRICATING SUCH DEVICES

(75) Inventors: Hongmei Wang, Boise, ID (US); Chandra Mouli, Boise, ID (US); Luan Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 10/925,339

(22) Filed: Aug. 24, 2004

(65) Prior Publication Data
US 2006/0043472 A1    Mar. 2, 2006

(51) Int. Cl.
*H01L 29/00* (2006.01)
(52) U.S. Cl. .................. 257/510; 257/118; 257/244; 257/466; 257/594
(58) Field of Classification Search .............. None
See application file for complete search history.

(56) References Cited

U.S. PATENT DOCUMENTS

| 6,410,948 | B1 | 6/2002 | Tran et al. ............ 257/202 |
| 6,642,090 | B1 | 11/2003 | Fried et al. ............ 438/164 |
| 2005/0170604 | A1* | 8/2005 | Orlowski et al. ......... 438/404 |
| 2005/0224800 | A1* | 10/2005 | Lindert et al. ........... 257/66 |
| 2006/0003596 | A1* | 1/2006 | Fucsko et al. .......... 438/758 |

FOREIGN PATENT DOCUMENTS

WO    WO 2004/038770 A2    5/2004

OTHER PUBLICATIONS

C.H. Lee, et al., Novel Body Tied FinFET Cell Array Transistor DRAM with Negative Word Line Operation for sub 60nm Technology and beyond, 2004 Symposium on VLSI Technology Digest of Technical Papers.
F. Fishburn, et al., A 78nm $6F^2$ DRAM Technology for Multigigabit Densities, 2004 Symposium on VLSI Technology Digest of Technical Papers.
R. Katsumata, et al., Fin-Array-FET on bulk silicon for sub-100 nm Trench Capacitor DRAM, 2003 Symposium on VLSI Technology Digest of Technical Papers.
T. Park, et al., Fabrication of Body-Tied FinFETs (Omega MOSFETs) Using Bulk Si Wafers, 2003 Symposium on VLSI Technology Digest of Technical Papers.

* cited by examiner

*Primary Examiner*—Wai-Sing Louie
(74) *Attorney, Agent, or Firm*—Fletcher Yoder

(57) ABSTRACT

A memory device having decreased cell size and having transistors with increased channel widths. More specifically, pillars are formed in a substrate such that sidewalls are exposed. The sidewalls of the pillars and the top surface of the pillars are covered with a gate oxide and a polysilicon layer to form a channel through the pillars. The current path through the channel is approximately equal to twice the height of the pillar plus the width of the pillar. The pillars are patterned to form non-linear active area lines having angled segments. The polysilicon layer is patterned to from word lines that intersect the active area lines at the angled segments.

24 Claims, 8 Drawing Sheets

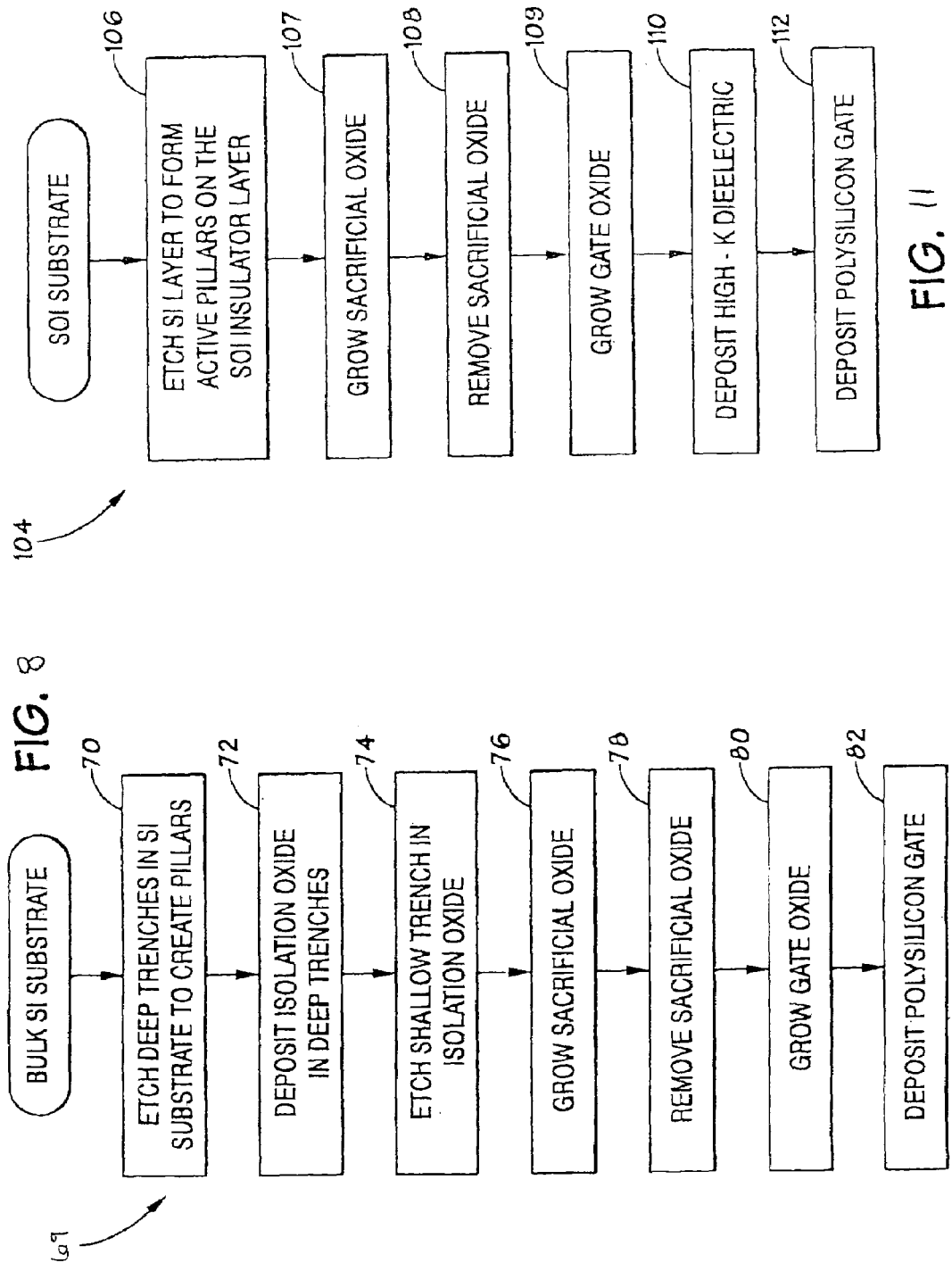

HIGH DENSITY ACCESS TRANSISTOR HAVING INCREASED CHANNEL WIDTH AND METHODS OF FABRICATING SUCH DEVICES

BACKGROUND OF THE INVENTION

1. Field of the Invention

The present invention relates generally to integrated circuits and, more particularly, to integrated circuits implementing high density transistors having increased channel widths.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Semiconductor memory devices, such as dynamic random access memory (DRAM) devices, are widely used for storing data in systems such as computer systems. A DRAM memory cell typically includes an access device such as a field effect transistor (FET) coupled to a storage device such as a capacitor. The access device allows the transfer of charges to and from the storage capacitor thereby facilitating read and write operations in the memory device. The memory cells are typically arranged in a number of rows and columns to provide a memory array.

With the constantly increasing demand for higher data storage capacity, memory arrays are becoming more dense. Memory density is typically limited by current processing technologies implemented to fabricate the memory arrays. Typical memory cell array topologies provide for feature sizes (F) which are limited by the width of the electrically conductive word lines and bit lines in the array, and the width of the isolation regions between the word lines and bit lines. Conventional array topologies provide for cell sizes on the order of $8F^2$. While this may be acceptable in most applications, a reduction in feature size, thereby enabling an increase in memory density, may be desirable.

Still further, increasing the density of the memory arrays without sacrificing performance capabilities is generally desirable. Among the concerns in fabricating memory devices is to provide memory cells with minimal leakage to prevent the loss of storage cell data. Further, alpha-particle induced soft errors which alter the data stored in the memory cells should also be considered, and simplification in fabrication techniques may also be desirable.

One technique for fabricating DRAM cells implements planar access transistors. As will be appreciated, sub-threshold characteristics and threshold characteristics greatly affect DRAM devices. Disadvantageously, improving sub-threshold characteristics may adversely affect threshold characteristics. Sub-threshold (off-state) characteristics of planar DRAM devices are closely associated with the device's ability to meet refresh requirements. Further, for low power applications, scaling down the threshold voltage of the DRAM device is important in accommodating low Vcc requirements. Over the past several generations (0.35 to 0.10 um technologies), access device threshold and sub-threshold voltages have not scaled down fast enough to meet these conflicting design specs.

Further, the performance of complimentary metal oxide semiconductor (CMOS) devices in the periphery portions of a DRAM may be constrained due to several unique processing steps in fabrication of the DRAM device. In particular, highly resistive polysilicon plug processes for providing access to the sources/drains of buried transistors, non-salicided active areas, back end heat steps, deactiviating anneals, etc., place limits on periphery device performance. It is desirable to have a process flow that does not compromise periphery logic while achieving acceptable characteristics for the access devices in the memory array.

Off-state characteristics in a MOS transistor are largely determined by the extent to which the gate controls the charge density in the channel region. Reducing gate oxide thickness increases the gate capacitance and therefore increases gate control. Double-gate or dual-gate transistors may be implemented to further increase gate control and reduce short channel effects but double gate transistors are often complex to manufacture and may not be practical in many applications. One type of double-gate structure implements FETs fabricated on silicon-on-insulator (SOI) substrates. Unfortunately these devices suffer from severe reduction in drive currents unless several "fins" are constructed along the width direction of the access device. These devices are generally referred to as "FinFETs," as will be appreciated by those skilled in the art. In a large width logic device, constructing several fins might be possible. However, in dense drives, such as DRAM arrays, the additional real estate that would be occupied by the additional fins makes the device impractical in such high density applications.

Further, implementing SOI substrates, rather than bulk silicon to fabricate DRAM devices introduces a number of design and operation issues. One consideration in implementing SOI devices is the floating body effect (FBE) due to lack of body contact. Controlling the FBE is one consideration in the integration of SOI devices in a DRAM process. As will be appreciated, fully depleted SOI devices generally exhibit less FBE. However, very thin silicon films are generally necessary for full depletion and this potentially introduces large variation in device characteristics for small variation in silicon film thickness. Even for relatively long devices (e.g., 0.25 um), large increases in sensitivity of threshold voltage to silicon film thickness generally occur.

Still further, as gate oxide thickness is scaled down to increase gate capacitance (and therefore, increase gate control of the channel region), several additional problems may arise. Poor gate oxide integrity, poor gate oxide life, direct tunneling due to high electric fields (gate current), soft breakdown, etc. are all considerations in DRAM device design and operation. In addition, for dual-gate polysilicon processes implementing both n+ and p+ gate polysilicon, boron penetration from the p+ polysilicon gate through the gate oxide into the channel may be problematic. To minimize boron diffusion, nitrided gate oxides may be implemented. Disadvantageously, for very thin gate oxides (e.g., less than 35 angstroms), the nitridation process (e.g., RPN, DPN) introduces a large number of trap states in the oxide and therefore further degrades oxide quality.

High dielectric constant materials like zirconium oxide, hafnium oxide and aluminum oxide have been proposed as replacement for silicon-dioxide ($SiO_2$) which is generally implemented to form the gate oxide. However, these materials have poor quality interface compared to $SiO_2$ and therefore severely degrade mobility in the channel. For this reason, a very small buffer $SiO_2$ layer is generally desirable between the silicon active area and high-k gate dielectric.

Most double gate structures have a silicon sidewall that has crystallographic planes different than the (100) plane. Because the oxidation rate is higher in crystal planes other than (100) due to higher silicon density in those planes and the higher trap state densities in those planes, gate oxide thickness along the silicon sidewalls are generally thicker than along the planar regions. Disadvantageously, this results in poor gate control along the sidewall. Another undesirable effect of growing gate oxide in the sidewall for nanometer scale devices is the decrease in the width of the device due to excessive gate oxide growth. As will be appreciated, decreasing the width of the device generally results in decreased total available drive current.

Embodiments of the present invention may address one or more of the problems set forth above.

BRIEF DESCRIPTION OF THE DRAWINGS

Advantages of the invention may become apparent upon reading the following detailed description and upon reference to the drawings in which:

FIG. 8 illustrates a technique for fabricating the transistor in a memory cell in accordance with the first exemplary embodiment of the present invention;

FIG. 11 illustrates a technique for fabricating the transistor in a memory cell in accordance with the second exemplary embodiment of the present invention.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
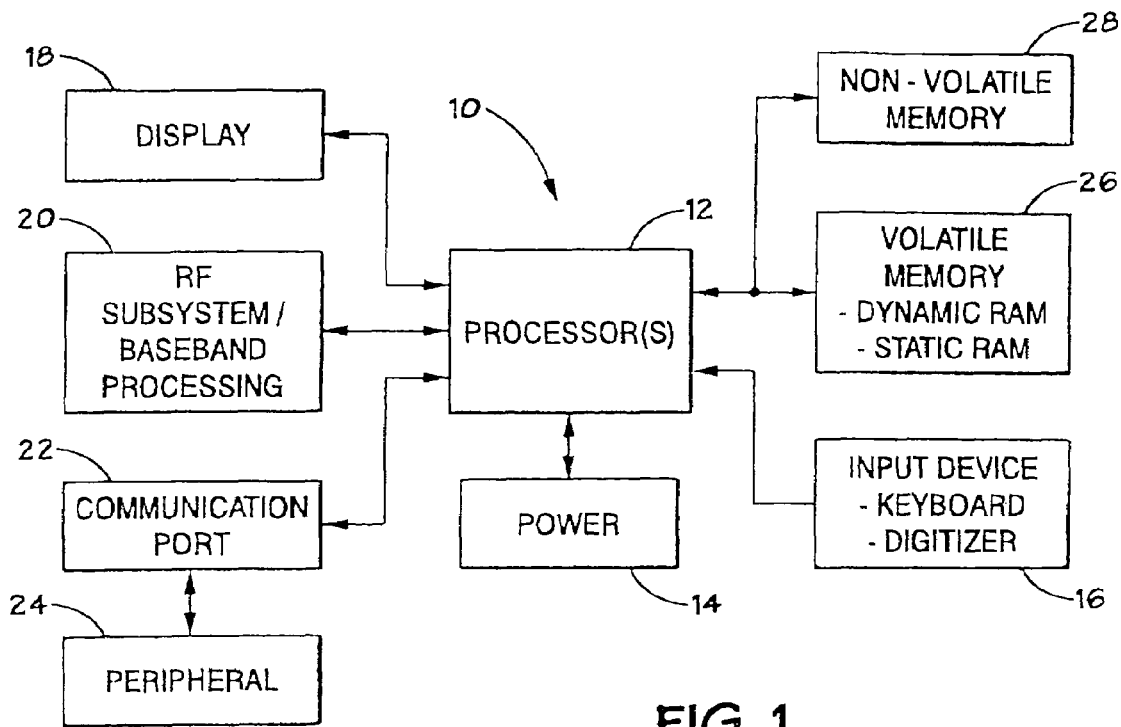
FIG. 1 illustrates a block diagram of an exemplary processor-based device in accordance with embodiments of the present invention.

Turning now to the drawings, and referring initially to FIG. 1, a block diagram depicting an exemplary processor-based system, generally designated by reference numeral 10, is illustrated. The system 10 may be any of a variety of types such as a computer, pager, cellular phone, personal organizer, control circuit, etc. In a typical processor-based device, one or more processors 12, such as a microprocessor, control the processing of system functions and requests in the system 10. As will be appreciated, the processor 12 may include an embedded North or South bridge (not shown), for coupling each of the aforementioned components thereto. Alternatively, the bridges may include separate bridges coupled between the processor 12 and the various components of the system 10.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance. Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

Because the processor 12 generally controls the functioning of the system 10 by implementing software programs, the memory is operably coupled to the processor 12 to store and facilitate execution of various programs. For instance, the processor 12 may be coupled to the volatile memory 26 which may include Dynamic Random Access Memory (DRAM) and/or Static Random Access Memory (SRAM). The volatile memory 26 may include a number of memory modules, such as single inline memory modules (SIMMs) or dual inline memory modules (DIMMs). As can be appreciated, the volatile memory 26 may simply be referred to as the "system memory." The volatile memory 26 is typically quite large so that it can stoic dynamically loaded applications and data.

The processor 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. Additionally, the non-volatile memory 28 may include a high capacity memory such as a tape or disk drive memory.

Figure 2:
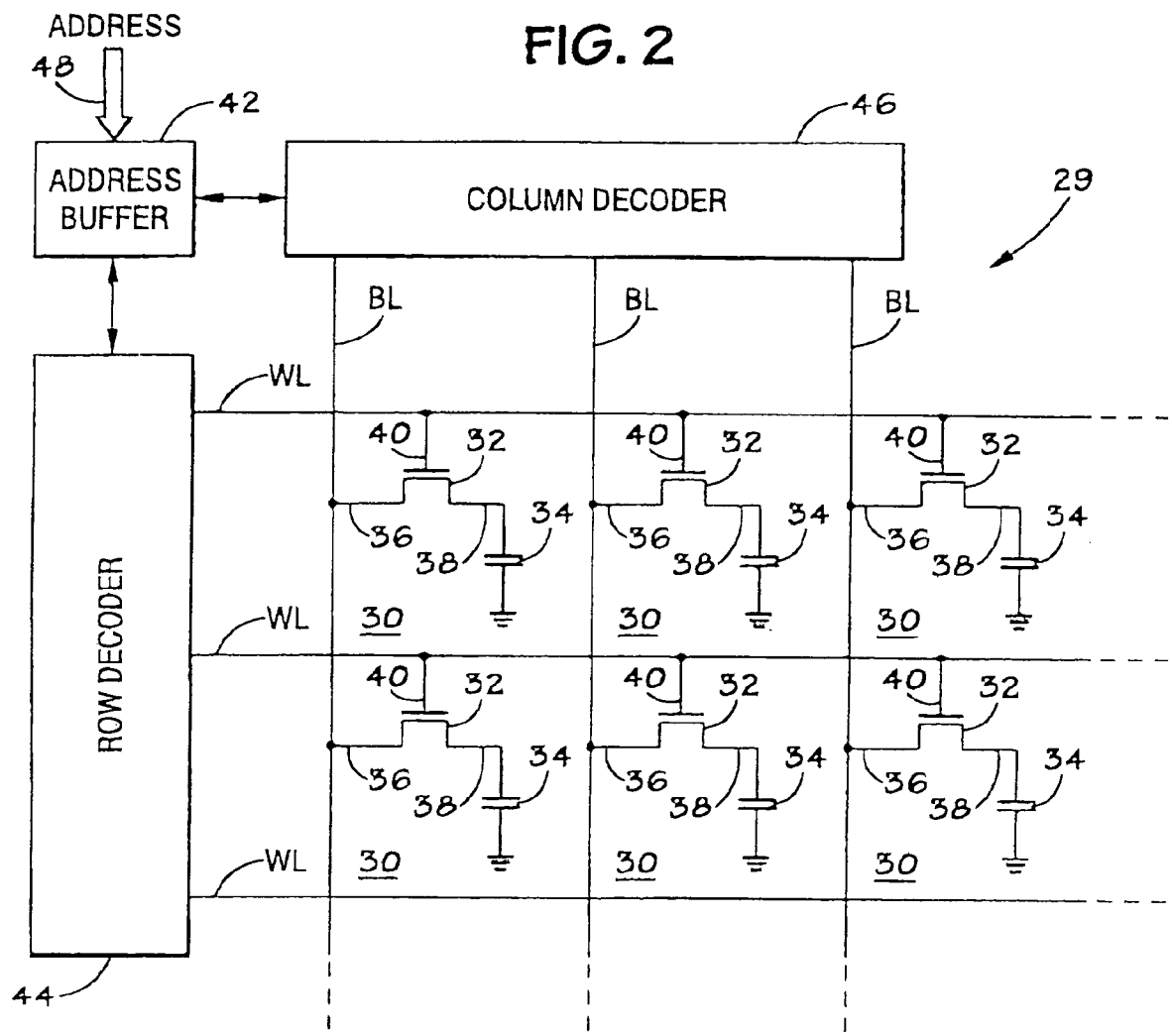
FIG. 2 illustrates a partial schematic illustration of an exemplary integrated circuit, incorporating an array of memory cells fabricated in accordance with embodiments of the present invention.

Referring to now to FIG. 2, a partial schematic illustration of an exemplary integrated circuit, such as a memory device 29, which may be implemented in the volatile memory 26, is illustrated. The memory device 29 includes an array of memory cells having transistors which may be fabricated in accordance with the techniques described herein is illustrated. In the present exemplary embodiment, the memory device 29 comprises a dynamic random access memory (DRAM) device. In the exemplary embodiment, the memory device 29 includes a number of memory cells 30 arranged in a grid pattern and comprising a number of rows and columns. The number of memory cells 30 (and corresponding rows and columns) may vary depending on system requirements and fabrication technology. However, in accordance with the present exemplary embodiment, the memory array is dense and may be fabricated to include cell sizes of $6F^2$ and less, as described further below with reference to FIGS. 4-11. Each memory cell 30 includes an access device and a storage device. In the present exemplary embodiment, the access device comprises a field effect transistor (FET) 32 and the storage device comprises a capacitor 34. The access device is implemented to provide controlled access to the storage device. In the exemplary memory cell 30, the FET 32 includes a drain terminal 36 and a source terminal 38. The capacitor 34 is coupled to the source terminal 38. The terminal of the capacitor 34 that is not coupled to the FET 32 may be coupled to a ground plane.

It should be noted that although the above description depicts the terminal of the access device coupled to the capacitor 34 as the "source" 38 and the other non-gate terminal of the access device as the "drain" 36, during read and write operations, the FET 32 may be operated such that each of the terminals 36 and 38 operates at one time or another as a source or a drain. Accordingly, for purposes of further discussion it should be recognized that whenever a terminal is identified as a "source" or a "drain," it is only for convenience and that in fact during operation of the FET 32 either terminal could be a source or a drain depending on the manner in which the FET 32 is being controlled by the voltages applied to the terminals 36, 38 and 40.

As previously described, the memory array is arranged in a series of rows and columns. To implement the data storage capabilities of a memory cell 30, an electrical charge is placed on the drain 36 of the FET 32 via a bit line (BL). By controlling the voltage at the gate 40 via the word line (WL), a voltage potential may be created across the FET 32 such that the electrical charge at the drain 36 can flow to the capacitor 34. As can be appreciated, by storing electrical charge in the capacitor 34, the charge may be interpreted as a binary data value in the memory cell 30. For instance, for a single-bit storage device, a positive charge above a known threshold voltage stored in the capacitor 34 may be interpreted as binary "1." If the charge in the capacitor 34 is below the threshold value, a binary value of "0" is said to be stored in the memory cell 30.

The bit lines BL are used to read and write data to and from the memory cells 30. The word lines WL are used to activate the FET 32 to access a particular row of a memory cell 30. Accordingly, the memory device 29 also includes a periphery portion which may include an address buffer 42, row decoder 44 and column decoder 46. The row decoder 44 and column decoder 46 selectively access the memory cells 30 in response to address signals that are provided on the address bus 48 during read, write and refresh operations. The address signals are typically provided by an external controller such as a microprocessor or another type of memory controller. The column decoder 46 may also include sense amplifiers and input/output circuitry to further enable data to be read to and from the memory cell 30 via the bit lines BL.

In one exemplary mode of operation, the memory device 29 receives the address of a particular memory cell 30 at the address buffer 42. The address buffer 42 identifies one of the word lines WL of the particular memory cell 30 corresponding to the requested address and passes the address to the row decoder 44. The row decoder 44 selectively activates the particular word line WL to activate the FET's 32 of each memory cell 30 that is connected to the selected word line WL. The column decoder 46 selects the bit line (or bit lines) BL of the memory cell 30 corresponding to the requested address. For a write operation, data received by the input/output circuitry is coupled to the selected bit line (or bit lines) BL and provides for the charge or discharge of the capacitor 34 of the selected memory cell 30 through the FET 32. The charge corresponds to binary data, as previously described. For a read operation, data stored in the selected memory cell 30, represented by the charge stored in the capacitor 34, is coupled to the select bit line (or bit lines) BL, amplified by the sense amplifier and a corresponding voltage level is provided to the input/output circuitry in the column decoder 46.

Figure 3:
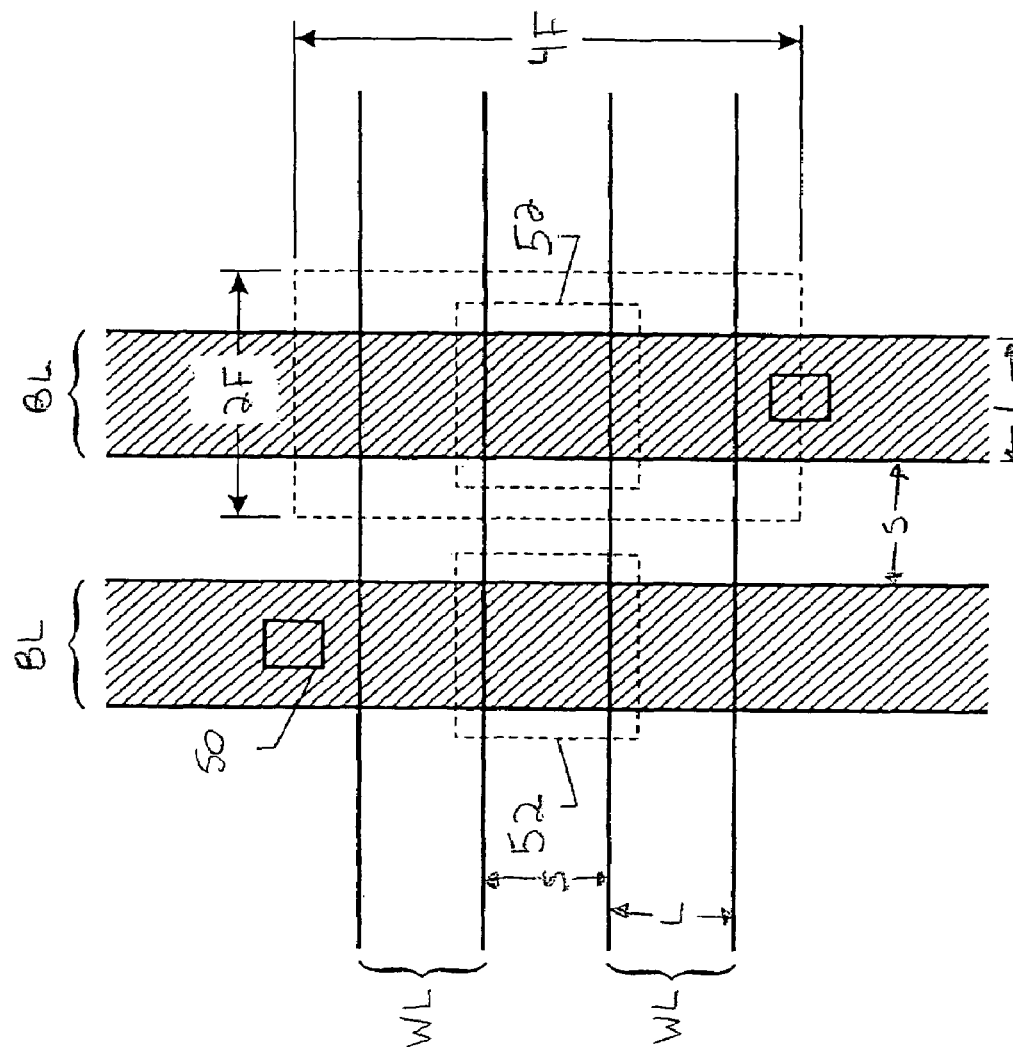
FIG. 3 illustrates a top view of an exemplary dynamic random access memory (DRAM) array layout.

FIG. 3 illustrates a top view of a portion of a typical memory cell array, such as a DRAM array. The word lines WL are arranged parallel to respect to one another and perpendicular to the bit lines BL, which are also arranged parallel with respect to one another. The bit line contacts 50 electrically couple the bit lines BL to the associated cell structure, generally indicated by reference numeral 52. As illustrated in FIG. 3, the bit lines BL are generally arranged directly over (or alternatively, under) the underlying active area of the memory cell 30.

The size of each memory cell 30 is typically described in terms of feature size (F). The feature size (F) is based on the width L of the electrically conductive traces (i.e., word lines WL and bit lines BL) and the width S of the isolation space between the conductive traces. The sum of L and S represents the minimum pitch of the memory cell 30. The feature size (F) is half of the minimum pitch, or half the sum of L and S. That is: $F=(L+S)/2$.

In the partial array illustrated in FIG. 3, the width of each memory cell 30 along the word line direction is 2F while the width along the bit line direction is 4F. This results in a cell size of $8F^2$ (2F×4F). While cells having a size of $8F^2$ may be acceptable, it may be desirable to provide cells having reduced sizes.

Figure 4:
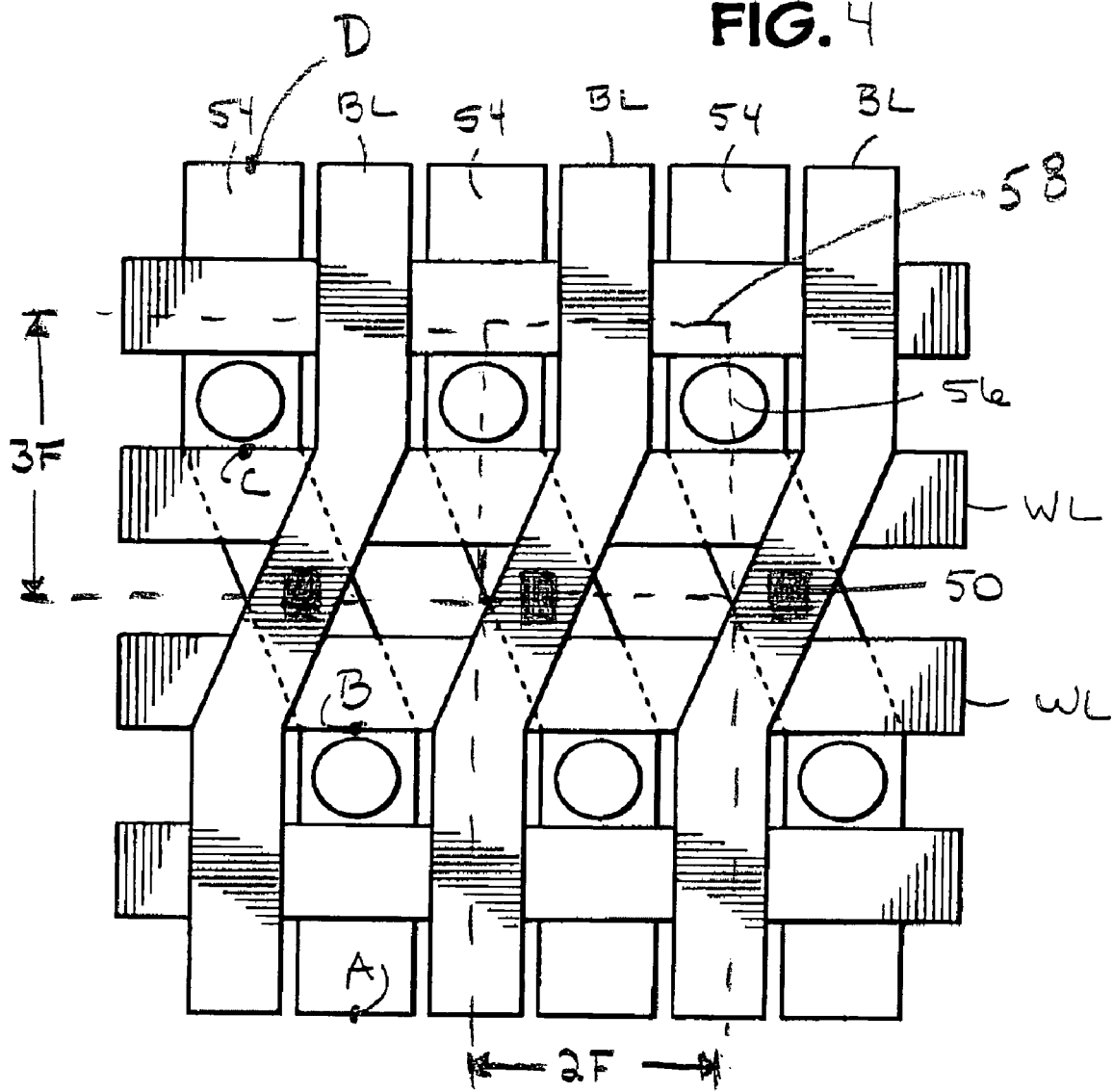
FIG. 4 illustrates a top view of a DRAM array layout fabricated in accordance with embodiments of the present invention.

Referring now to FIG. 4, a top view of a portion of a memory cell array, such as a DRAM array, fabricated in accordance with the present techniques, is illustrated. As described further below, the access FETs 32 are generally formed in a substrate in a plurality of continuous active areas 54 running generally parallel to each other. Each active area 54 is defined by isolation regions, as will be described and illustrated with reference to FIGS. 5-7, 9 and 10. To form the FET 32 in an active area 54, impurity doped regions are formed in the substrate to provide the source 38 and drain 36 of the FET 32 (illustrated in FIGS. 6 and 9). The word lines WL form the gate of the FET 32. The bit lines BL also include bit line contacts 50 for coupling the bit lines BL to the underlying active areas 54. Contacts 56 represent the contact points for coupling the capacitor 34 of the memory cell 30 to the active area 54.

As will be appreciated, the word lines WL are generally arranged parallel to one another. Also, the bit lines BL are arranged parallel to one another. Similarly, the active areas 54 are arranged parallel to one another. To provide for memory cells 30 having a reduced cell size, in accordance with embodiments of the present invention, the continuous active area lines 54 are not straight or linear, but rather "weave" relative to the substrate within which they are formed such that bends are created in each active area line 54 as it extends across the array. As used herein, "non-linear" is synonymous with "weavy." That is to say that the active area lines 54 are patterned such that they form continuous lines having bends intentionally formed therein. The continuous active area lines 54 can be viewed in segments wherein each of the segments intersects each other at an angle greater than 0°. For instance, as depicted in FIG. 4, the first active area line 54 extends upward from point A to point B. From point B to point C, the active area line 54 extends at an angle towards the left. From point C to point D, the active area line 54 extends at an angle towards the right. The next segment of the active area line 54 (not shown) would extend at an angle towards the right and then, the pattern would be repeated through the entire length of the active area line 54. The angle of each bend is in the range of greater than 0° up to approximately 45°.

Thus, in accordance with embodiments of the present invention, the word lines WL of the memory array are disposed linearly straight and parallel with respect to one another and with respect to the planar surface of the underlying substrate. Conversely, the active area lines 54 and the bit lines BL, which are formed to traverse the direction of the word lines WL (i.e., are not parallel to the word lines WL), are non-linear with respect to the surface of the substrate. Accordingly, the word lines WL intersect the angled portions of the active area lines 54. That is to say that the intersection of the word lines WL to the active area lines 54 is non-orthogonal. While the bit lines BL are disposed in a plane other than the plane of the word lines WL (generally above), the projection of the grid formed by the word lines WL and the bit lines BL would display a similar structure wherein the projected intersection of the word lines WL and bit lines BL is non-orthogonal.

The area consumed by a single memory cell 30 in accordance with the present exemplary embodiment, is indicated by the dashed outline 58. To illustrate the reduction in cell size, the area indicated by the dashed outline 58 may be described relative to the cell area indicated in FIG. 3. As illustrated in FIG. 4, a single memory cell in accordance with the present exemplary embodiment has cell dimensions of 2F by 3F, thus providing a consumed area for a single memory cell 30 of about $6F^2$. In accordance with one exemplary embodiment, the feature size F is less than or equal to approximately 0.13 micrometers.

As will be appreciated, the aforementioned techniques may be implemented to advantageously provide a high density memory array having reduced cell sizes. To provide increased gate control and drive current in these higher density memory arrays, a further improvement is contemplated, wherein raised pillars and shallow trench isolation (STI) may be implemented in conjunction with the aforementioned techniques.

As can be appreciated, a large number of FETs 32 are implemented in the array portion of the memory device 29. Further, the peripheral portions of the memory device 29, which are often fabricated on the same substrate as that used to fabricate the array portion, may implement a large number of transistors, as well. In accordance with exemplary embodiments of the present invention, the FETs 32 having reduced cell size may be fabricated using shallow trench isolation (STI) to increase the width of the channel in the FET 32, thereby increasing the gate control and drive current of the FET 32. Trenches may be formed in a substrate and filled with an oxide or any other dielectric material which is suitable for providing electrical isolation between adjacent FETs 32. The substrate may comprise a bulk silicon substrate, a silicon-on-insulator (SOI) substrate or a Silicon Germanium (SiGe) substrate, for instance. The oxide regions may be etched to form shallow recesses in the oxide region, thereby exposing raised silicon pillars extending from the surface of the substrate. A polysilicon gate may be disposed about the raised pillars thereby increasing the channel width of the FET 32, without increasing the size of the memory cell 30. By increasing the channel width, the drive current of the FET 32 is increased. As will be appreciated, increasing the drive current of the FET 32 is advantageous, especially in high speed memory devices. Further, because there is more gate control on the silicon sidewall, short channel performance is improved and the body effect is reduced.

Figure 5:
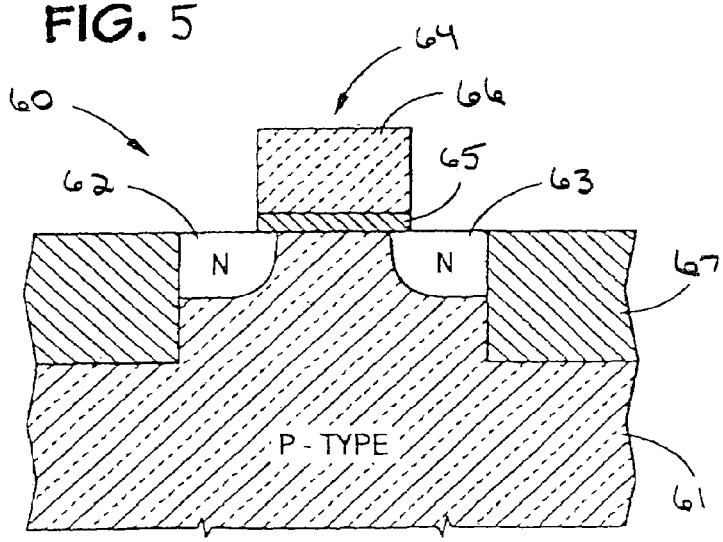
FIG. 5 illustrates a partial cross-sectional view taken along the length of a transistor fabricated in accordance with a first exemplary embodiment of the present invention.
Figure 6:
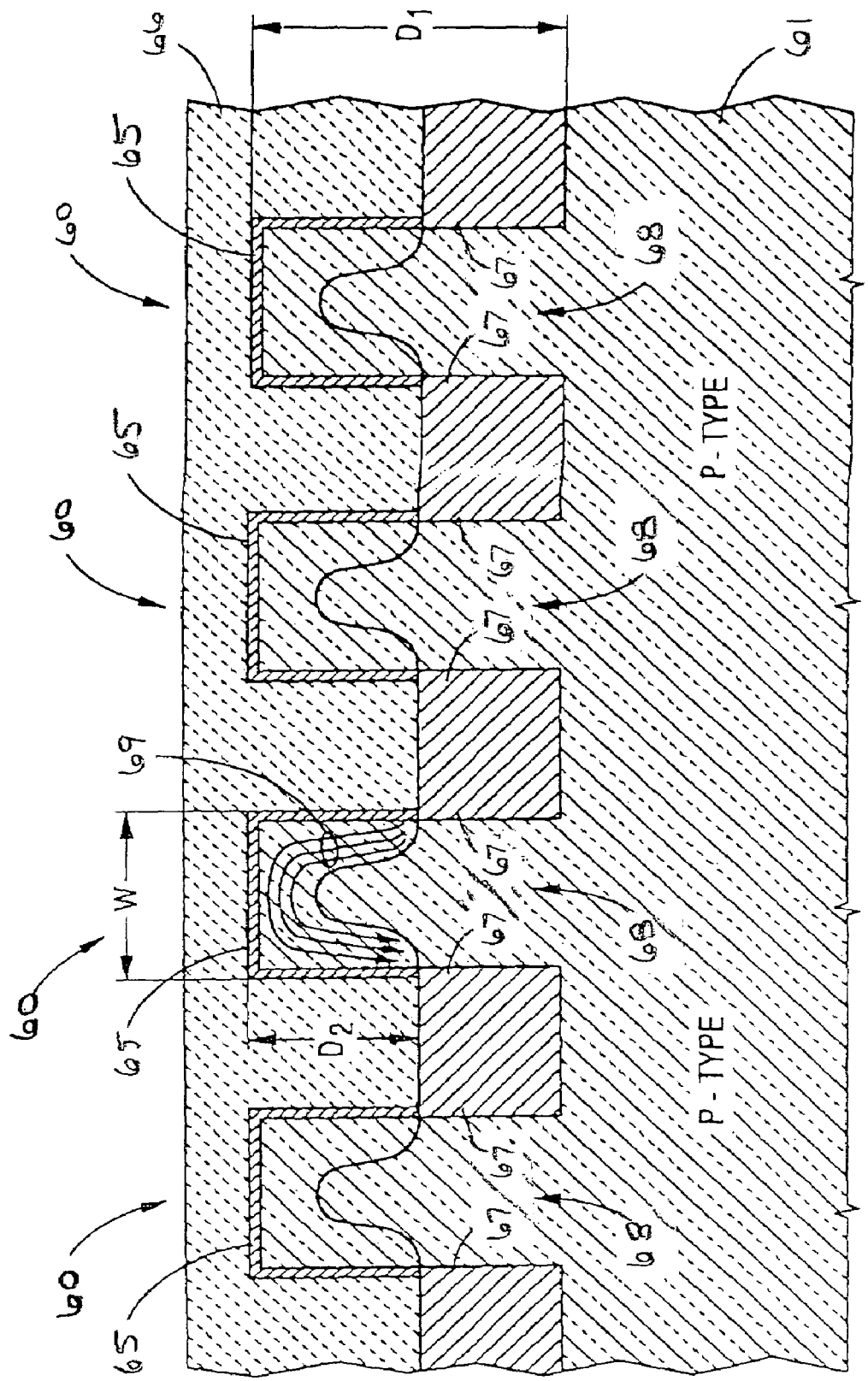
FIG. 6 illustrates a partial cross-sectional view taken along the width of a transistor fabricated in accordance with the first exemplary embodiment of the present invention.
Figure 7:
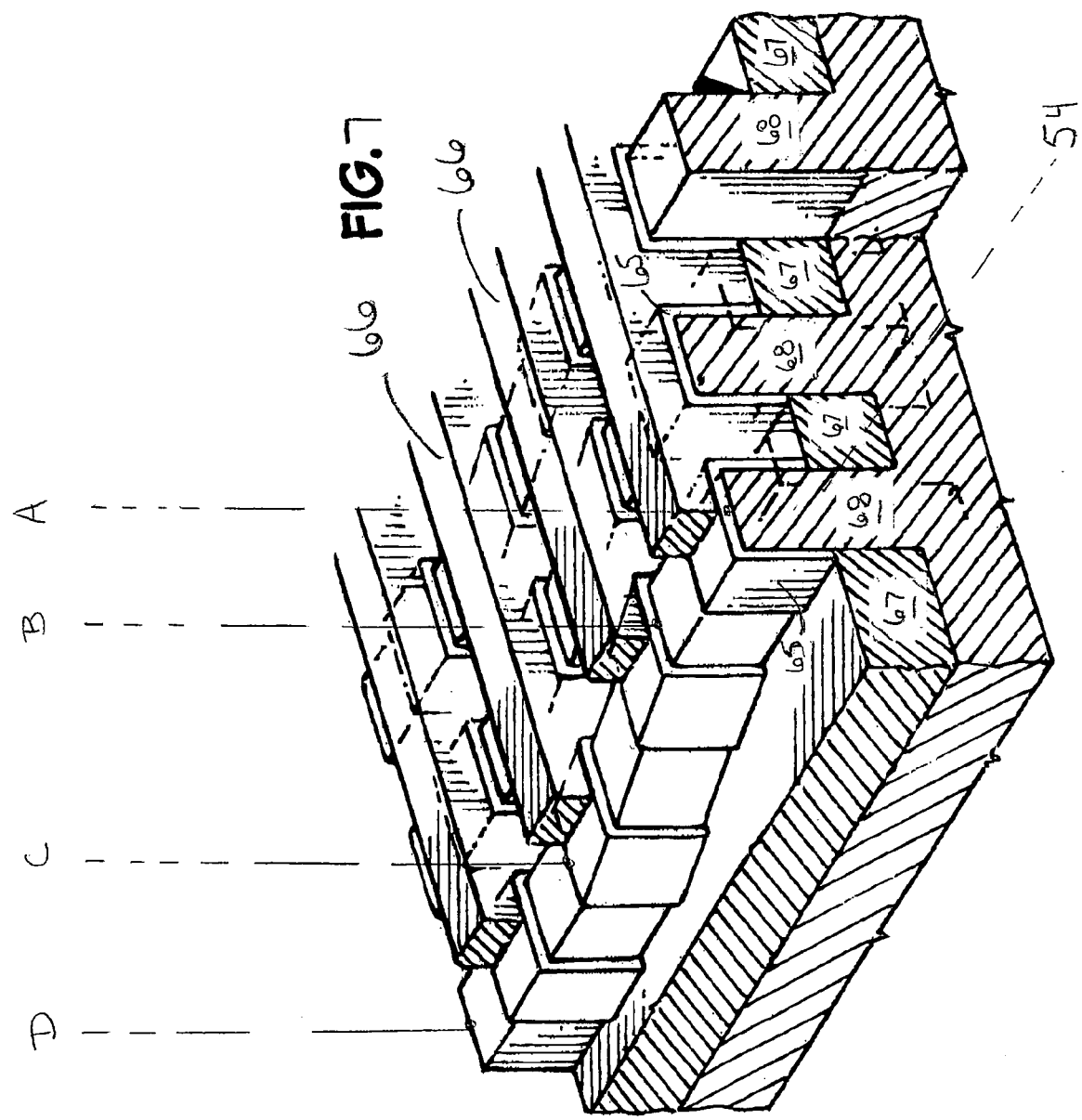
FIG. 7 illustrates a top perspective view of the DRAM array of FIGS. 4-6 fabricated in accordance with embodiments of the present invention.

Referring now to FIGS. 5-8, an exemplary embodiment of the present invention wherein the substrate comprises a bulk silicon material is illustrated. FIG. 5 illustrates a partial cross-sectional view of one embodiment of the access FET 32, taken along the length of the FET 32. The exemplary embodiment of the FET 32 illustrated in FIGS. 5 and 6 is generally designated as reference numeral 60. FIG. 6 illustrates a partial cross-sectional view of four adjacent FETs 60, taken along the width of the channels. FIG. 7 illustrates a top perspective view of a portion of a memory array fabricated in accordance with the present techniques of implementing both non-linear active area lines and STI. An exemplary process flow for fabricating the FET 60 illustrated in FIGS. 5-7 will be discussed with reference with FIG. 8 below.

The FET 60 is generally fabricated on a p-type substrate 61. As best illustrated in FIG. 5, the substrate 61 includes doped regions 62 and 63 which form the drain and source of the FET 60. The FET 60 also includes a gate 64 which generally comprises a gate oxide layer 65 and a conductive layer, such as a polysilicon layer 66, which are patterned and etched to form conductive word lines such that the FET 60 may be controlled by the peripheral portions of the memory device 29. Alternatively, a metal layer or a silicon germanium (SiGe) layer may be disposed and patterned to form the conductive word lines. The FET 60 also includes trenches which are filled with an oxide 67 such that adjacent FETs 60 are electrically isolated. Alternatively, the trenches may be filled with another dielectric material via a spin process, such that a spin-on dielectric (SOD) provides the trench isolation between adjacent FETs 60.

As illustrated in FIG. 6, trenches are generally etched in the surface of the substrate 61 to provide silicon pillars 68 extending from the surface of the substrate 61. As best illustrated with reference to FIG. 7, the pillars 68 are fabricated to form the active area lines 54 (FIG. 4) of the memory array. Accordingly, the pillars 68 are patterned to extend such that they traverse the surface of the substrate 61. It should be noted that while the pillars 68 of FIG. 6 illustrate angled edges, alternatively, the edges of the pillars 68 may be rounded. As will be discussed further below, the pillars 68 are also patterned and etched such that they form the aforementioned, non-linear active areas having angles formed therethrough.

The initial trenches in the substrate 61 may have a depth of greater than 4,000 angstroms, for instance. In a preferred exemplary embodiment, the trench has a depth D1 in the range of approximately 4,000-12,000 angstroms. After the oxide 67 is deposited to completely fill the trenches, the oxide 67 is etched to provide a shallow trench or recess within the oxide layer 67 and between each of the silicon pillars 68. In one exemplary embodiment, the depth D2 of the shallow trench within the oxide 67 is in the range of approximately 400-10,000 angstroms. After forming the shallow trenches in the oxide 67, a gate oxide 65 is grown or deposited about the portion of the silicon pillar 68 left exposed by the etching of the oxide layer 67 to form the shallow trenches in the oxide layer 67. Finally, the polysilicon layer 66 is deposited over the structure to form the polysilicon gate.

As can be appreciated, by providing the shallow trenches or recesses in the oxide 67, the polysilicon gate 66 is disposed on not only the top surface of the active area of the channel, but along the sidewalls of the pillar 68, thereby providing an extra current path 69 between the source 63 and drain 62, as indicated in one of the FETs 60 of FIG. 6. As a result, the total channel width is the width W of the pillar 68 plus 2 times the height of the exposed portion of the pillar 68 (i.e., channel width=W+(2*D2)). Advantageously, by increasing the total channel width, the drive current of the FET 60 may be increased. Further, the gate may be controlled from three directions through the silicon pillar (i.e., from the top and from each sidewall). As a result, the gate control in the present exemplary embodiments is better than with conventional planar transistors and the short channel effect and the body effect are suppressed.

Referring now to FIG. 7, a top perspective view of a portion of the memory array having non-linear active area lines 54, as described in FIG. 4 and FETs 60 fabricated with STI regions, as described in FIGS. 5 and 6, is illustrated. As indicated in FIG. 7, the pillars 68 have been patterned to form the active areas 54 extending through the memory array. The active area lines 54 are formed such that they are non-linear, as previously described with reference to FIG. 4. As in FIG. 4, the illustrated portion of the active area line 54 includes a first segment extending from point A to point B, a second angled segment extending from point B to point C and a third segment extending from point C to point D and extending in the same direction as the first segment. As indicated in FIGS. 4 and 7, the polysilicon layer 66 forms the word lines WL of the memory array and intersects the active area line 54 at the angled segments of the active array line 54.

FIG. 7 does not illustrate the bit lines BL which are fabricated above the word lines WL and active area lines 54. However, it should be appreciated that the bit lines BL may be formed in a complimentary pattern with the active area lines 54, as illustrated in FIG. 4. The contact regions may be formed to provide electrical contact between the bit lines BL and the underlying active area lines 54.

Referring now to FIG. 8, an exemplary process flow 69 for fabricating the FETs 60 of FIGS. 5-7 is illustrated. First, deep trenches may be etched to form the pillars 68 in the bulk silicon substrate 61, as indicated in block 70. The deep trenches may have a depth (and thus, the pillars 68 may have a height) in the range of approximately 4,000 angstroms-12,000 angstroms. The deep trenches may be etched by any one of a number of commonly known etching techniques, such as plasma etching, ion beam etching or reactive ion etching (RIE), for example. Each pillar 68 may have a width W in the range of approximately 300-2,000 angstroms, for example. As can be appreciated, the specific heights and widths of the features and materials described herein are exemplary in nature and are meant for purposes of illustration only. Accordingly, the exemplary dimensions provided herein are in no way meant to limit the scope of the present techniques. As previously described, the pillars 68 are etched such that they form the active area lines 54 having angled segments.

Once the deep trenches are etched, thereby forming the pillars 68, the deep trenches are filled with an isolation trench oxide 67, as indicated in block 72. The oxide 67 will provide junction isolation for the FET 60. After the trenches are filled with the isolation oxide 67, the oxide 67 may be etched such that a shallow trench or recess having a depth D2 is formed in the oxide 67, thereby forming exposed portions of the pillars 68, as indicated in block 74.

Next, a sacrificial oxide (not shown) is grown to remove silicon defects on the surface and round the corners of the silicon pillars 68, as indicated in block 76. Next, the sacrificial oxide is removed, as indicated in block 78 and the gate oxide 65 is grown or deposited, as indicated in block 80. The thin gate oxide layer 65 may comprise silicon dioxide ($SiO_2$), oxide nitride oxide (ONO) or other high-k dielectric material, for example and may be applied or grown on the exposed surface of the pillars 68 by wet or dry oxidation, for instance. The oxide layer 65 may be grown on the surface of the wafer by placing the substrate 61 in a heated chamber and exposing the wafer to oxygen gas, as can be appreciated by those skilled in the art. Alternatively, the oxide layer 65 may be deposited over the pillars 68.

Finally, a conductive material, such as an insitu doped polysilicon 66 (i.e., polysilicon having doping levels in the range of approximately $10^{16}$ to $10^{22}$ atoms/cm$^3$), amorphous silicon or micro-crystal silicon, for example, may be deposited in the channel by a suitable deposition process, such as chemical vapor deposition (CVD), plasma enhanced chemical vapor deposition (PECVD), or photo enhanced CVD, for example, as indicated in block 82. The conductive material may be deposited in a diffusion furnace or using a single wafer tool, for example. The polysilicon layer 66 forms the gate of the FET 60. The polysilicon layer 66 and the underlying oxide layer 65 may be patterned to form word lines of the memory array, as previously described. As previously described, the polysilicon layer 66 is patterned such that the word lines WL intersect the active area lines 54 at the angled segments of the active area lines 54. As will be appreciated, the exemplary embodiment of the FET 60 described above may also be implemented in the transistors of the peripheral portion of the memory device 29.

Figure 9:
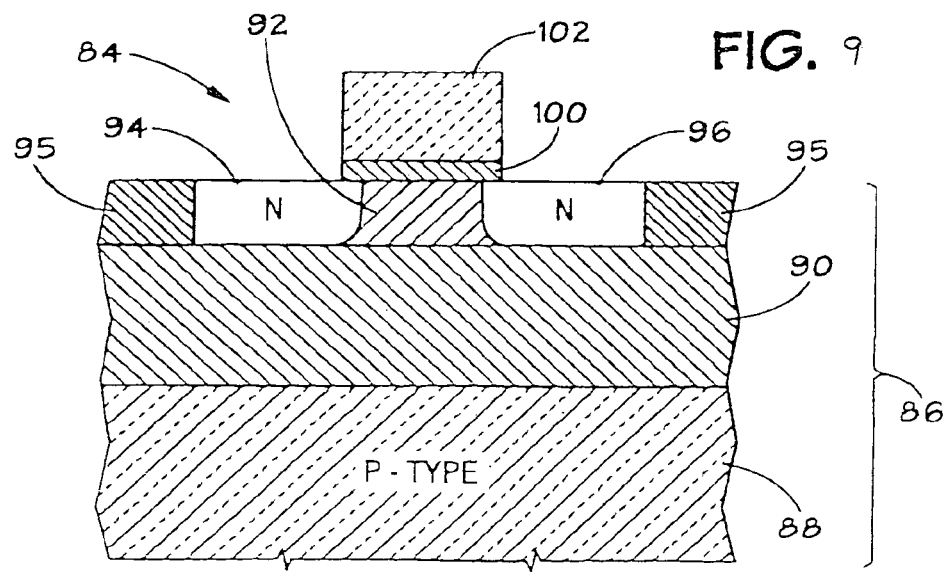
FIG. 9 illustrates a partial cross-sectional view taken along the length of a transistor fabricated in accordance with a second exemplary embodiment of the present invention.
Figure 10:
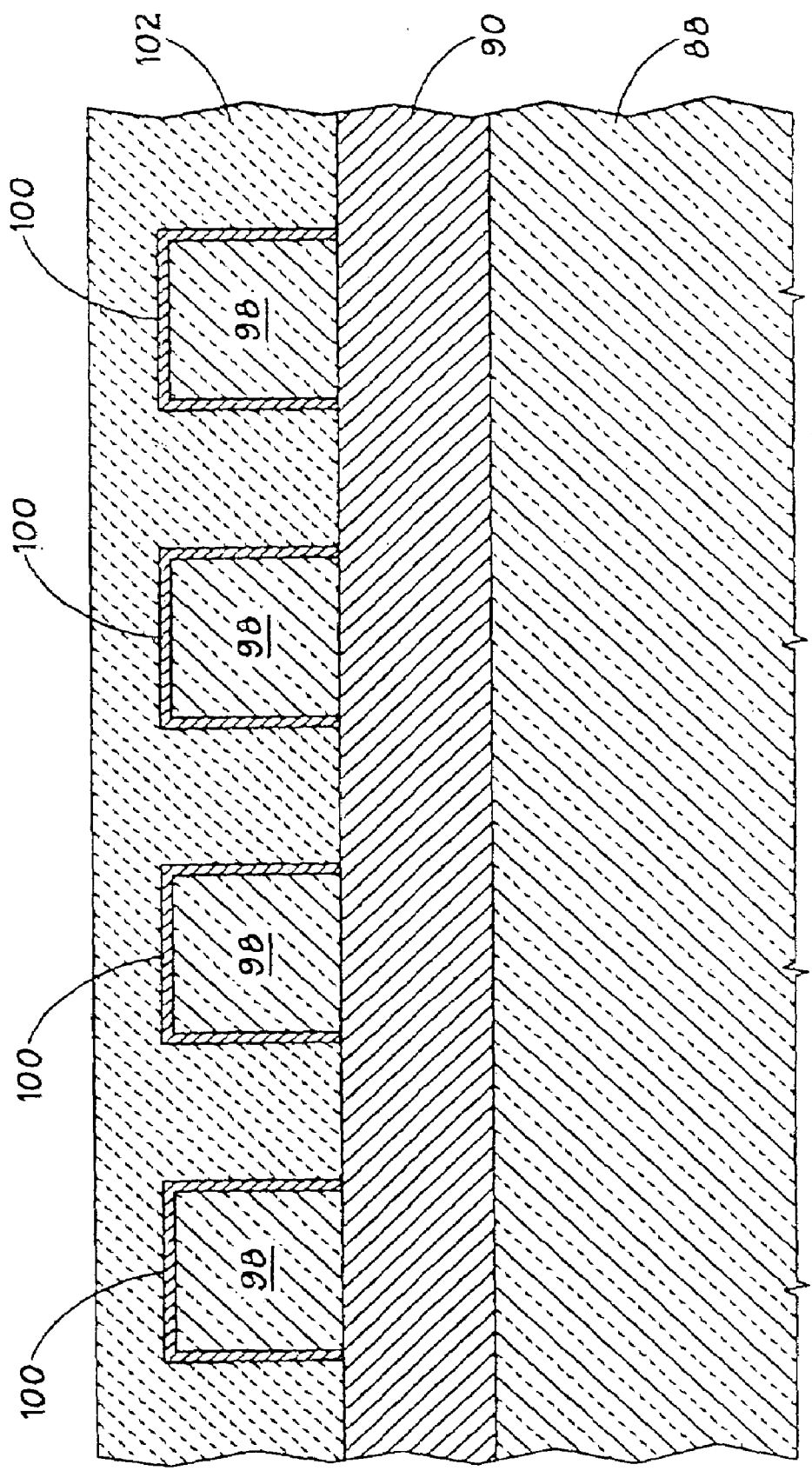
FIG. 10 illustrates a partial cross-sectional view taken along the width of a transistor fabricated in accordance with the second exemplary embodiment of the present invention.

Referring now to FIGS. 9-11, an alternate exemplary embodiment of the present invention wherein the substrate comprises a silicon-on-insulator (SOI) substrate is illustrated and should be viewed in conjunction. FIG. 9 illustrates a partial cross-sectional view of one embodiment of the access FET 32, taken along the length of the FET 32. The exemplary embodiment of the FET 32 illustrated in FIGS. 9 and 10 is generally designated as reference numeral 84. FIG. 10 illustrates a partial cross-sectional view of four adjacent FETs 84, taken along the width of the channels. An exemplary process flow for fabricating the FET 84 illustrated in FIGS. 9 and 10 will be discussed with reference with FIG. 11 below.

FIG. 9 illustrates a partial cross-sectional view of a FET 84 fabricated on a silicon-on-insulator (SOI) substrate 86, along the length of the channel. As will be appreciated, the SOI substrate 86 includes a silicon layer 88, having an insulator 90, such as an oxide or glass, thereon. A thin layer of silicon 92 having a thickness of 200-3000 angstroms forms a channel between the drain 94 and the source 96 of the FET 84. As will be appreciated, the channel is formed through the thin layer of silicon 92 between the doped regions 94 and 96. To increase the width of the channel in the FET 84, the silicon layer 92 may be patterned to form pillars, as described above and discussed further below. As with the embodiment illustrated and described with reference to FIGS. 5-7, isolation trenches may be etched in the silicon 92, and the trenches may be filled with an isolation oxide 95.

As best illustrated in FIG. 10, the silicon layer 92 may be etched to the insulator layer 90, thereby creating silicon pillars 98 in the silicon layer 92. It should be noted that while the pillars 98 of FIG. 10 illustrate angled edges, alternatively, the edges of the pillars 98 may be rounded. After forming the shallow trenches in the silicon layer 92, a gate oxide 100 is grown or deposited about the portion of the silicon pillar 98 left exposed by the etching of the silicon layer 92. The gate oxide 100 may include multiple high-k dielectric and buffer layers. Finally, the polysilicon layer 102 is deposited over the structure to form the polysilicon gate. As described above with reference to the embodiment illustrated in FIGS. 5-7, the increased channel width is equal to the width of the pillars 98 plus twice the height of the pillars 98 since the current path between the drain 94 and source 96 now includes the sidewalls of the pillar 98.

Further, a memory array having increased drive control as a result of the STI techniques described with reference to FIGS. 9 and 10 and having a reduced cell size (on the order of $6F^2$) may be fabricated by implementing the non-linear active area lines having angled segments. As with the embodiment described with reference to FIGS. 4-8, the active area lines may be patterned in the SOI substrate such that they form angle non-linear active area lines having angled segments in the range of greater than 0° and no more than approximately 45°. The word lines WL may be disposed such that they intersect the active area lines a the angled segments. The bit lines may be fabricated in a complimentary pattern with respect to the active area lines, as previously described.

Referring now to FIG. 11, an exemplary process flow 104 for fabricating the FETs 84 of FIGS. 9 and 10 is illustrated. First, the silicon layer 92 is etched to create active area islands or pillars 98 on the surface of the SOI insulator 90, as indicated in block 106. The pillars 98 may be etched by any one of a number of commonly known etching techniques, such as plasma etching, ion beam etching or reactive ion etching (RIE), for example. Each pillar 98 may have a width W in the range of approximately 300-2,000 angstroms, and a height of approximately 500 angstroms, for example. As can be appreciated, the specific heights and widths of the features and materials described herein are exemplary in nature and are meant for purposes of illustration only. Accordingly, the exemplary dimensions provided herein are in no way meant to limit the scope of the present techniques. As previously described, the pillars 98 are etched such that they form the active area lines 54 having angled segments.

Next, a sacrificial oxide (not shown) is grown to remove silicon defects on the surface and round the corners of the silicon pillars 98, as indicated in block 107. Next, the sacrificial oxide is removed, as indicated in block 108, and the gate oxide 100 is grown or deposited, as indicated in block 109. The thin gate oxide layer 100 may comprise silicon dioxide ($SiO_2$) or oxide nitride oxide (ONO), for example and may be applied or grown on the exposed surface of the pillars 98 by wet or dry oxidation, for instance. The oxide layer 100 may be grown on the surface of the wafer by placing the substrate 88 in a heated chamber and exposing the wafer to oxygen gas, as can be appreciated by those skilled in the art. The oxide layer 100 may be grown to a thickness of less than 10 angstroms, for instance. After the gate oxide 100 is grown, a high-k dielectric layer, such as zirconium oxide may be disposed, as indicated in block 110. The high-k dielectric layer may be deposited at a thickness of less than approximately 50 angstroms. The oxide layer 100 is a buffer layer between a high-k dielectric layer and the silicon to reduce stress. Finally, the polysilicon layer 102 is deposited over the structure to form the polysilicon gate, as indicated in block 112. The polysilicon layer 102 may be patterned to form word lines of the memory array, as previously described. As previously described, the polysilicon layer 102 is patterned such that the word lines WL intersect the active area lines 54 at the angled segments of the active area lines 54. As will be appreciated, the exemplary embodiment of the FET 84 described above may also be implemented in the transistors of the peripheral portion of the memory device 29. Further, as will be appreciated hybrid structures may be implemented wherein a bulk silicon substrate may be implemented in accordance with the present techniques to fabricate either the memory array portion or the peripheral portion of the memory device 29, with an SOI substrate is implemented to fabricate the other of the array portion or the peripheral portion.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of fabricating a memory device comprising:
   etching deep trenches in a silicon substrate to form continuous silicon pillars that weave in a direction parallel to the surface of the substrate;
   depositing an isolation material into the deep trenches to completely fill the deep trenches;
   etching shallow trenches in the isolation material such that a portion of the silicon pillars extend from the planar surface of the isolation material;
   forming a gate oxide on a top surface of the silicon pillars and along sidewalls of the silicon pillars; and
   depositing a conductive layer, such that the conductive layer fills the shallow trenches and completely covers the gate oxide.

2. The method, as set forth in claim 1, wherein etching deep trenches comprises etching trenches having a depth in the range of approximately 3,000-12,000 angstroms.

3. The method, as set forth in claim 1, wherein etching shallow trenches comprises etching trenches having a depth in the range of approximately 400-10,000 angstroms.

4. The method, as set forth in claim 1, wherein etching shallow trenches to form continuous silicon pillars comprises etching trenches comprising first segments formed at an angle with respect to second segments of the trenches.

5. The method, as set forth in claim 1, wherein etching shallow trenches to form continuous silicon pillars comprises etching trenches comprising first segments formed at an angle with respect to second segments of the trenches, wherein the angle is greater than 0° and less than or equal to approximately 45°.

6. The method, as set forth in claim 1, wherein forming a gate oxide comprises growing the gate oxide.

7. The method, as set forth in claim 1, wherein depositing the isolation material comprises depositing an oxide into the deep trenches.

8. The method, as set forth in claim 1, wherein depositing the isolation material comprises depositing a spin-on dielectric into the deep trenches.

9. A method of fabricating a memory device comprising:
    etching trenches in a top silicon layer of a silicon on insulator substrate to form continuous silicon pillars that weave in a direction parallel to the surface of the substrate;
    forming a gate oxide on a top surface of the silicon pillars and along sidewalls of the silicon pillars;
    depositing a high-k dielectric material on the gate oxide; and
    depositing a conductive layer, such that the conductive layer fills the shallow trenches and completely covers the gate oxide.

10. The method, as set forth in claim 9, wherein etching trenches comprises etching trenches having a depth in the range of approximately 200-3,000 angstroms.

11. The method, as set forth in claim 9, wherein etching shallow trenches to form continuous silicon pillars comprises etching trenches comprising first segments formed at an angle with respect to second segments of the trenches.

12. The method, as set forth in claim 9, wherein etching shallow trenches to form continuous silicon pillars comprises etching trenches comprising first segments formed at an angle with respect to second segments of the trenches, wherein the angle is greater than 0° and less than or equal to approximately 45°.

13. The method, as set forth in claim 9, wherein forming a gate oxide comprises growing the gate oxide.

14. The method, as set forth in claim 9, wherein depositing the conductive layer comprises depositing a polysilicon layer.

15. The method, as set forth in claim 9, wherein depositing the conductive layer comprises depositing a metal layer.

16. The method, as set forth in claim 9, wherein depositing the conductive layer comprises depositing a silicon germanium (SiGe) layer.

17. A method of fabricating an integrated circuit comprising the acts of:
    forming a plurality of continuous pillars in a substrate material, the pillars extending from the surface of the substrate and forming an array of non-linear rows, wherein each of the non-linear rows are parallel to the surface of the substrate and have a plurality of a plurality of first segments extending in a first direction, a plurality of second segments extending in a second direction and a plurality of third segments extending in a third direction, wherein the first direction and the third direction are complimentary directions and where in the first and third directions are different from that second direction;
    forming a gate oxide along a top surface and sidewalls of the plurality of pillars; and
    disposing a conductive layer to completely cover the gate oxide.

18. The method, as set forth in claim 17, wherein forming the plurality of pillars comprises forming a plurality of channels of a transistor.

19. The method, as set forth in claim 18, wherein forming the plurality of channels comprises forming the plurality of channels having a current path equal to approximately two times a height of the pillars plus the width of the pillars.

20. The method, as set forth in claim 17, wherein forming the plurality of pillars in a substrate material comprises forming a plurality of pillars in a bulk silicon substrate.

21. The method, as set forth in claim 17, wherein forming the plurality of pillars in a substrate material comprises forming a plurality of pillars in a silicon on insulator (SOI) substrate.

22. The method, as set forth in claim 17, wherein forming the plurality of pillars in a substrate material comprises forming a plurality of pillars in a silicon germanium (SiGe) substrate.

23. The method, as set forth in claim 17, wherein disposing a polysilicon layer comprises forming a word line in a memory array.

24. The method, as set forth in claim 23, wherein forming a word line comprises forming a word line which intersects the plurality of continuous pillars non-orthogonally.

* * * * *